United States Patent
Sháněl et al.

(10) Patent No.: US 11,574,794 B2
(45) Date of Patent: Feb. 7, 2023

(54) BEAM TRAJECTORY VIA COMBINATION OF IMAGE SHIFT AND HARDWARE ALPHA TILT

(71) Applicant: FEI Company, Hillsboro, OR (US)

(72) Inventors: Ondřej L. Shánĕl, Brno (CZ); Trond Karsten Varslot, Vuku (NO); Ondřej R. Bačo, Pristpo (CZ); Martin Schneider, Brno (CZ)

(73) Assignee: FEI Company, Hillsboro, OR (US)

( * ) Notice: Subject to any disclaimer, the term of this patent is extended or adjusted under 35 U.S.C. 154(b) by 143 days.

(21) Appl. No.: 17/210,223

(22) Filed: Mar. 23, 2021

(65) Prior Publication Data
US 2022/0310354 A1 Sep. 29, 2022

(51) Int. Cl.
*H01J 37/20* (2006.01)
*H01J 37/22* (2006.01)

(52) U.S. Cl.
CPC ............ *H01J 37/20* (2013.01); *H01J 37/222* (2013.01); *H01J 2237/1505* (2013.01); *H01J 2237/1534* (2013.01); *H01J 2237/20207* (2013.01); *H01J 2237/20214* (2013.01); *H01J 2237/226* (2013.01)

(58) Field of Classification Search
CPC .. H01J 37/20; H01J 37/222; H01J 2237/1505; H01J 2237/1534; H01J 2237/20207; H01J 2237/20214; H01J 2237/226
See application file for complete search history.

(56) References Cited

U.S. PATENT DOCUMENTS

| | | | | |
|---|---|---|---|---|
| 7,474,419 | B2* | 1/2009 | Tappel | H01J 37/20 356/615 |
| 7,626,165 | B2* | 12/2009 | Iwasaki | G01N 23/2251 430/297 |
| 11,398,365 | B1* | 7/2022 | Own | H01J 37/1472 |
| 2012/0235036 | A1* | 9/2012 | Hatakeyama | H01J 37/20 250/310 |
| 2019/0198290 | A1* | 6/2019 | Inoue | H01J 37/3177 |
| 2020/0104980 | A1* | 4/2020 | Inoue | G06T 3/60 |

FOREIGN PATENT DOCUMENTS

| | | | | |
|---|---|---|---|---|
| EP | 2056332 A1 | * | 5/2009 | H01J 37/20 |
| JP | 2001256912 A | * | 9/2001 | |
| JP | 2004301852 A | * | 10/2004 | |

* cited by examiner

*Primary Examiner* — David A Vanore
(74) *Attorney, Agent, or Firm* — Klarquist Sparkman, LLP (57) ABSTRACT

Methods include holding a sample with a movement stage configured to rotate the sample about a rotation axis, directing an imaging beam to a first sample location with the sample at a first rotational position about the rotation axis and detecting a first transmitted imaging beam image, rotating the sample using the movement stage about the rotation axis to a second rotational position, and directing the imaging beam to a second sample location by deflecting the imaging beam in relation to an optical axis of the imaging beam and detecting a second transmitted imaging beam image, wherein the second sample location is spaced apart from the first sample location at least at least in relation to the optical axis. Related systems and apparatus are also disclosed.

26 Claims, 4 Drawing Sheets

BEAM TRAJECTORY VIA COMBINATION OF IMAGE SHIFT AND HARDWARE ALPHA TILT

FIELD

The field is imaging with electron beams and other energy sources.

BACKGROUND

Tomography is a set of imaging techniques that involves taking numerous images of an object with energy that penetrates the object's interior and then using the images of the object to produce a three-dimensional reconstruction of the object with one or more reconstruction algorithms, such as filtered back projection or iterative reconstruction. Tomography examples include magnetic resonance imaging, CT scanning, and ultrasound tomography, but many other techniques and radiative energy sources exist. Electron-based tomography, such as electron tomography or cryogenic electron tomography are also tomographic approaches and are generally applicable to tomographic imaging of small samples, e.g., from microns to the atomic scale, given the shorter wavelength of the imaging particles. However, problems remain in electron-based tomography, including poor image-to-image alignment, missing wedges where tilt-series image sets are used, and an overall inadequate imaging quality with low dose exposure and noisy images. In particular, imaging quality can be impacted by drifting of the sample being imaged and contamination of the sample that can occur during the image acquisition process. Thus, a need remains for improvements to electron-based tomographic approaches.

SUMMARY

According to an aspect of the disclosed technology, methods include holding a sample with a movement stage configured to rotate the sample about a rotation axis, directing an imaging beam to a first sample location with the sample at a first rotational position about the rotation axis and detecting a first transmitted imaging beam, rotating the sample using the movement stage about the rotation axis to a second rotational position, and directing the imaging beam to a second sample location by deflecting the imaging beam in relation to an optical axis of the imaging beam and detecting a second transmitted imaging beam, wherein the second sample location is spaced apart from the first sample location at least in relation to the optical axis. In some examples, the second sample location being spaced apart from the first sample location at least in relation to the optical axis comprises a spacing at least in the direction of the rotation axis. Some examples further include directing the imaging beam to one or more additional sample locations at one or more additional rotational positions and detecting corresponding transmitted imaging beam images, wherein the first sample location at the first rotational position, the second sample location at the second rotational position, and the one or more additional sample locations at the one or more additional rotational positions comprise an imaging beam helical imaging trajectory for the sample. Some examples further include, before the sample is at the second rotational position, directing the imaging beam to one or more additional sample locations by deflecting the imaging beam, wherein the first sample location and the one or more additional sample locations are spaced apart from each other in the direction of the rotation axis. In some examples, the sample is held at the first rotational position as the imaging beam is deflected to the one or more additional sample locations. The spacing of the first sample location and an adjacent one of the one or more additional sample locations can also correspond to a helical imaging period. In some examples, the spacing the one or more additional sample locations adjacent to the first sample location is part of a helical imaging trajectory separate from a helical imaging trajectory of the first sample location. Some examples further include descanning the imaging beam after transmission through the second sample location to correct an aberration associated with the deflection. In some examples, a 3D tomogram of the sample can be reconstructed from the detected transmitted imaging beam images. In some examples, the sample is held at the first and second rotational positions for respective durations associated with a drift attenuation threshold before the imaging beam is directed to the respective first or second sample locations while the sample is held at the respective first or second rotational positions. In some examples, first and second sample locations are translationally spaced apart collinear with or parallel to the rotation axis. In some examples, the sample is rotated continuously while the electron beam is directed to the first sample location and directed to the second sample location. Some examples include translating the sample along the rotation axis to an adjacent position to continue helical imaging of the sample. Some examples include directing the imaging beam to a third rotational position without rotating the sample with the movement stage by deflecting the imaging beam. In selected examples, the imaging beam is deflected away from the rotational axis and towards the sample. Some examples include blanking the imaging beam for one or more durations between the directing of the beam to the first sample location and the second sample location. In representative examples, the imaging beam is an electron beam. Some examples further include directing the imaging beam to one or more additional sample locations, wherein the sample locations comprise a circular imaging beam trajectory.

According to another aspect of the disclosed technology, imaging systems include imaging beam optics configured to direct an imaging beam along an optical axis to a sample to a first sample location, a beam deflector configured to direct the imaging beam away from the optical axis to a second sample location, a movement stage configured to hold the sample and to rotate the sample about a rotation axis angled with respect to the optical axis, an imaging sensor configured to detect the imaging beam after transmission through the sample, and a processor and memory coupled to the imaging beam optics, beam deflector, and movement stage, wherein the memory includes code that, when executed by the processor, causes the movement stage to rotate the sample to first and second rotational positions, and causes the beam deflector to deflect the imaging beam such that the second sample location is spaced apart from the first sample location at least in relation to the optical axis. In some examples, the second sample location being spaced apart from the first sample location at least in relation to the optical axis comprises at least a spacing in the direction of the rotation axis. In some examples, the code causes the movement stage to rotate the sample to one or more additional rotational positions and causes the beam deflector to deflect the imaging beam such that the imaging beam is directed to one or more additional sample locations spaced apart from each other and the first and second sample locations to form a helical trajectory at the sample. In some examples, the code causes the beam deflector, before the sample is at the second rotational position, to deflect the imaging beam to one or more additional sample locations, wherein the first sample location and the one or more additional sample locations are spaced apart from each other in the direction of the rotation axis. In some examples, the code is configured to cause the movement stage to hold the sample at the first rotational position as the imaging beam is deflected to the one or more additional sample locations. In some examples, the code is configured to cause the beam deflector to direct the imaging beam to a third rotational position without the movement stage rotating the sample by deflecting the imaging beam away from the rotational axis and optical axis and towards the sample at an angle. Some examples include a descanning unit configured to descan the imaging beam after transmission through the second sample location to correct an aberration associated with the deflection. In representative examples, the imaging beam is an electron beam.

According to a further aspect of the disclosed technology, methods include, with a sample held at a first rotational position, directing an imaging beam to a first plurality of sample locations, each of the first plurality of locations located along a rotation axis, by deflecting the imaging beam along at least a first axis, and detecting a respective plurality of transmitted imaging beams, rotating the sample about the rotation axis to a second rotational position, and, with the sample held at the second rotational position directing the imaging beam to a second plurality of sample locations by deflecting the imaging beam along at least a second axis, and detecting a respective plurality of the transmitted imaging beams. In some examples, the first axis and the second axis are the same axis and correspond to the rotation axis. In further examples, one or more of the transmitted imaging beams at the first rotational position and one or more beams at the second rotational position comprise a helical imaging sequence.

The foregoing and other objects, features, and advantages of the disclosed technology will become more apparent from the following detailed description, which proceeds with reference to the accompanying figures.

DETAILED DESCRIPTION

Helical tomography generally involves taking numerous images of a sample in a helical manner, i.e., at numerous angles or projection locations around a sample, and using those images to form a 3D reconstruction of the sample. While promising, the quality of helical tomography 3D reconstructions based on electron beams or other imaging beam energy sources such as CT, ultrasound, etc., can be generally poor or variable, and the process can be associated with numerous difficulties given the precision and technical requirements of the process. An example of a difficulty is the vibration of the sample after performing a movement of the sample during the image acquisition process, which results in a problem of blurry images. One approach to address the blurriness of the images is establishing a time for the sample to settle after movement and before acquiring an image. By allowing the sample a sufficient settling duration after a sample is rotated and/or translated to a new position for the next image in the helical sequence or other imaging sequence, component images of reasonable quality can be obtained. However, given the microscopic environment, the settling duration tends to be excessive and may lead to additional problems. For example, after rotating and translating a sample to a new position, drifting can be induced by the movement and can continue due to various mechanical imperfections or tolerances in the system and movement stage.

As has been determined, a typical drift associated with rotational movement of the sample by the stage is typically in the range of nm/min, such as 10 nm/min, 5 nm/min, 2 nm/min or smaller, while drift associated with translational movement by the stage is typically in the range of tens of nm per minute, such as about 100 nm/min, 50 nm/min, 10 nm/min, etc. The larger drift range associated with the translational movement also tends to produce a larger settling duration for the sample before the drift of the sample is within a sufficiently low threshold to produce images of sufficient quality for use in helical tomographic reconstructions in which features can be delineated and useful information obtained. The larger settling duration associated with the translational movement also can be further compounded by the rotational movement.

For example, after rotating and translating to a new imaging position, a settling duration of tens of seconds, such as 20-40 seconds, or even minutes, can be required before a subsequent image of a helical sequence can be obtained. Because tomographic imaging can typically require collection of numerous images in a helical sequence in order to perform a sufficiently detailed and resolvable reconstruction, the time required to perform tomographic imaging of a sample can be excessive. Further, the imaging quality for many samples can be strongly impacted by the length of the imaging process. For example, samples often can be imaged at cryogenic temperatures in which increased imaging duration also increases the probability of contamination from condensates such as ice or other particulates. For many biological or other samples at cryogenic temperatures, the imaging dose of electrons or other imaging source energy also becomes an important consideration because a higher dose can damage underlying crystalized proteins or other structures thereby reducing image quality. A sequence of cylindrical cross-sections can also be obtained by taking a collection of tilt-series rotational image sequences, each rotational image sequence associated with a fixed axial position, but the drift problems persist due to the numerous high-drift translations. Further, the reconstruction problem using the acquired data ends up being poorly posed, yielding excessive computational processing time, e.g., for matrix inversion, or due to poor alignment of the rotational image sequence slices. Image quality might be improved by producing more, smaller, or overlapping cylindrical cross-sections, but the computational power requirements increase as well as the applied dose, effectively leading to a further decline in sample processing capability and image quality.

In representative examples of the disclosed technology, image sequence acquisition durations can be substantially reduced by deflecting the imaging beam instead of translating the sample for at least a portion of the images collected for the image sequence. For convenience, many of the following imaging system examples describe the use electrons as an imaging beam energy. It will be appreciated that additional tomography examples can use similar arrangements with other imaging beam energies generated from corresponding energy sources, ultrasound, photons of various energies, such as x-ray, terahertz, microwave, etc. For example, x-ray imaging systems can include x-ray tube, synchrotron as sources of energy beam, multilayer x-ray mirrors and diffraction based elements to provide beam deflection and descanning, and scintillator based and solid state x-ray detectors to detect transmitted energy beam. Ultrasound imaging systems can include piezoelectric ultrasound transducer as source of energy beam, metal mirrors to provide beam deflection and descanning, piezoelectric ultrasound transducer to detect transmitted energy beam.

Figure 1:
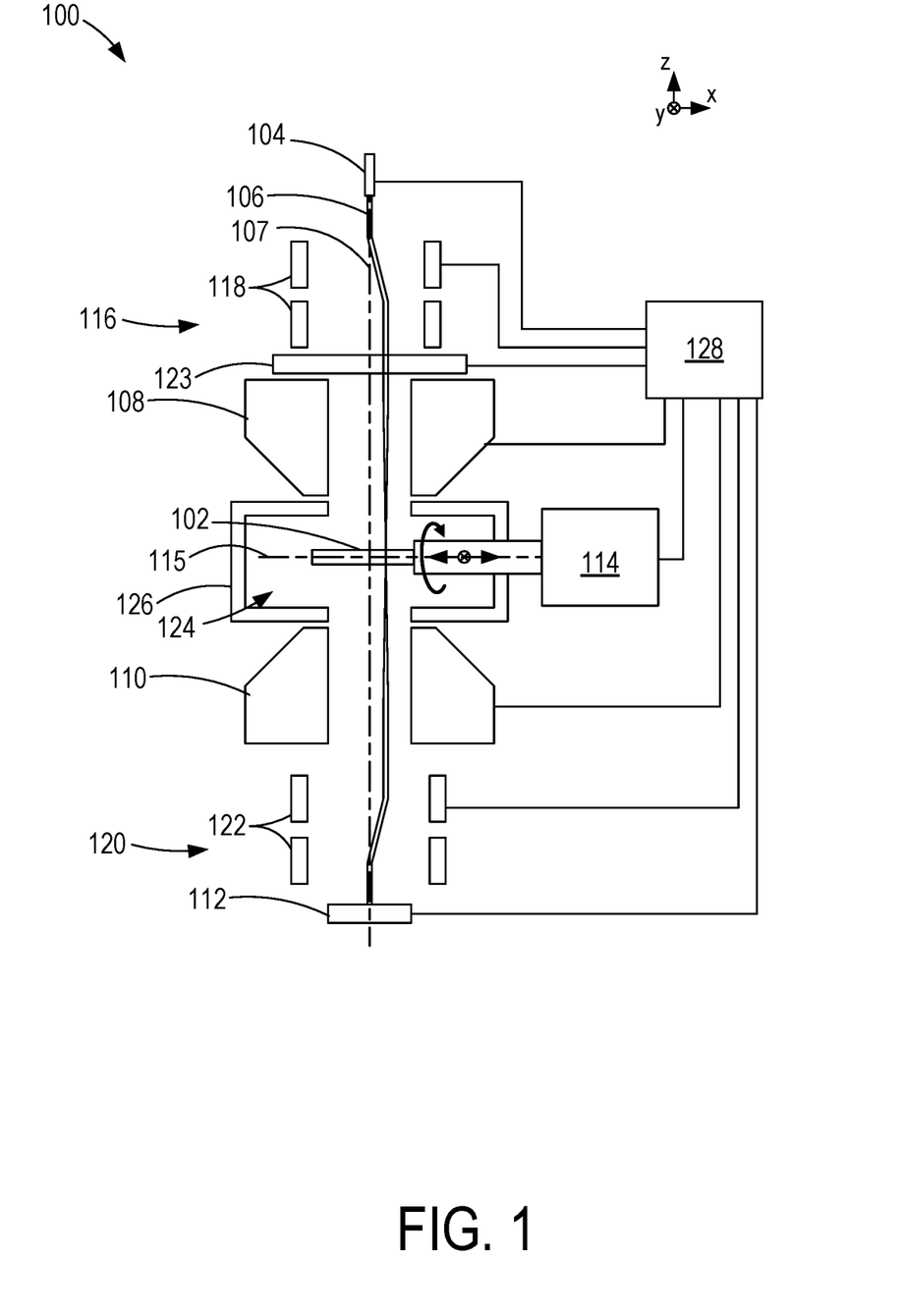
FIG. 1 is a side-view schematic of an electron microscope.

FIG. 1 shows an example imaging system 100 in the form of a transmission electron microscope configured to perform helical imaging of a sample 102 and to provide beam deflection that can reduce helical imaging sequence duration. The sample 102 can have various shapes and cross-sections, such as cylindrical, planar, cuboid, square, circular, square, polygonal, rectangular, etc. The imaging system 100 includes an electron beam source 104 configured to produce a beam 106 along an optical axis 107 (an axis generally aligned with the z-direction as shown in the figure) and electron optics, such as one or more objective lens elements 108, 110 configured to direct the beam 106, including through the sample 102. The beam 106 is typically received by an electron imaging detector 112 after transmission through the sample 102 so as to provide an image of the sample 102 at a particular orientation. Suitable electron detectors can include direct and indirect detectors or sensors, including CCD, CMOS, pixel arrays, photomultiplier tubes, etc. The beam 106 can be focused one or more times before it is received by the detector 112, including at or near the sample. The particular orientation of the sample 102 is provided by a movement stage 114 configured to hold and vary the orientation of the sample 102 by rotation about an axis 115 (shown aligned with the x-direction in the figure) and translation along one or more axes (e.g., x, y, and z). The movement stage 114 can be configured to move and position the sample, such as at a central or offset position, or to compensate for a drift. For example, in transmission electron microscope (TEM) examples, the movement along the y-direction is typically not used for scanning. In scanning transmission electron microscope (STEM) examples, scanning can be in both x- and y-directions. In further examples, the beam source 104 can include other energy sources such as x-ray, ultrasound, etc., the optics can be configured to direct imaging beams other than electrons, and the detector 112 can be configured to detect imaging beams other than electrons.

The imaging system 100 further includes a beam deflector 116 configured to direct the beam 106 away from the axis 107 so that the beam 106 impinges on the sample at a translated position relative to the intersection of the axis 107 and sample 102, e.g., along the x direction or both the x and y directions. In the illustrative depiction in FIG. 1, the beam 106 is shown translated in the x-direction by the beam deflector 116. In some examples, the beam deflector 116 includes beam deflection coils 118, such as magnetic or electrostatic coils, DC coils, AC coils, fast-scan coils, etc. In this way, various imaging sequences can be efficiently collected, e.g., forming helical trajectories, as well as additional or other trajectories or shapes, including double helical, circular, serpentine, saddle, 2D lattice of points, 3D lattices, etc., in tomographic as well as other applications.

In some examples, the imaging system 100 can further include a descanning unit 120, e.g., with coils 122 similar to the coils 118. The coils 122 can be used to deflect the beam 106 back towards the optical axis 107. However, the descanning unit 120 is not mandatory. In particular examples, the descanning unit 120 can be used to reduce optical aberrations that can be introduced by deflecting the beam 106 away from the axis 107. For example, some helical tomography applications can include samples extending in significant distances in a scan direction, such as in the x-direction or the x- and y-directions. With large deflections, the beam 106 can become aberrated due to increased off-axis or non-paraxial beam content. By way of example only, a sample maximally extending five to tens of μm in the x-direction can be within a field of view through which aberrations may be minimal and descanning may be optional. In further examples, mechanical sample translation can be performed with sufficiently small increments and maximum beam deflection ranges such that the additional benefit from descanning after beam deflection can be reduced to make the descanning optional. In some small sample examples, such as with high-resolution atomic reconstructions, lengths can be less than 1 μm, 0.1 μm, or 0.01 μm in a scan direction, making descanning potentially unnecessary. In examples with larger samples, such as tens to hundreds of μm, the beam descanning unit 120 can be desirable. In high-resolution atomic reconstructions, descan can be desirable from 0.1 μm shifts and higher. In some examples, ranges can include descanning of a beam shift up to about tens of microns, though there is generally no limit at lower values. Examples of the imaging system 100 can also include a beam blanking unit 123 configured to block the beam for selected durations, such as between imaging times or during beam deflection or stage movement.

By coordinating beam deflection with rotation of the movement stage, the quantity of mechanical translations of the sample 102 by the movement stage 114 that may be normally required can be reduced, leading to substantial reductions in helical image sequence durations. In general, beam deflection can substitute for all a portion of mechanical translations of the sample 102, and in some examples for portions of mechanical rotations as well. While the range of deflection of the beam 106 is limited such that it generally cannot be deflected a large distance away from the axis 107, by shifting small adjustments from the movement stage 114 to the beam deflector 116 the sample drift after movement can be minimized. Various techniques can be employed to provide this helical imaging enhancement through beam deflection, as will now be discussed in further detail.

Without beam deflection, a helical sequence can be performed by providing the sample at a particular rotational and translational orientation, waiting until the associated sample drift settles below a threshold after the movement to the orientation, imaging the sample, then rotating and translating to a subsequent helical position, e.g., translating in the x-direction along axis 115 and rotating about the axis 115 by a rotation angle increment. Example translations can be in the tens to hundreds of nm, to microns, to tens of microns, etc., and example translations can include 0.25 degree or less, 0.5 degree, 1 degree, 1.5 degrees, 2 degrees, 5 degrees, etc. Translations can be configured such that images partially overlap in the direction of translation, though some examples can share an image border. 3D imaging sequences can also be compiled by concatenating a series of segment image sequences, with each segment image sequence including a images for a sequence of rotational positions for a particular fixed translational position.

With beam deflection, however, a helical imaging sequence, or any other desired imaging sequence, can be obtain at a number of desired rotational orientations while avoiding any drift associated with translation of the sample. Although the process will include waiting until the associated sample drift settles below a threshold after the movement to each orientation, the longer settle time associated with translation can be omitted. For example, the sample may be imaged, then rotated to a subsequent azimuth of a helical position, e.g., rotating about the axis 115 by a rotation angle increment, and deflecting the beam along axis 115 to produce an effective translation in the x-direction for the helical position. Thus, with the combination of physical rotation and beam deflection, a series of images may be acquired of various cross-sections/projections of a sample with minimal physical movement and increased throughput. Such technique can provide the same, or better, information as a fully-physical based system but with fewer movements and decreased overhead due to misalignments. For example, a sample may be rotated to a desired position and imaged to acquire a projection. Subsequently, adjacent projections may be acquired using beam deflection on one or more sides of the original projection before rotating or translating the sample to a new location. Once moved to the new location, additional projections around this location are acquired using beam deflection.

In some beam deflection examples of the imaging system 100, the movement stage 114 provides the sample 102 at a particular orientation, e.g., situated near an intersection of the axis 107 and a eucentric position of the beam 106 where the sample 102 may be preferably positioned for imaging. In general, a eucentric position of the sample 102 corresponds to a position (such as a point, line, or height) where a tilt rotation, e.g., by using the movement stage 114 to rotate the sample 102 about axis 115, does not cause substantial displacement of the sample 102 in the field of view of the microscope that would require repositioning or realignment. In some examples, the sample 102 is held in a temperature and pressure controlled cryogenic volume 124 with a housing 126. After settling, the sample 102 is imaged and the sample 102 is rotated to a new angular position with the movement stage 114 and without mechanical translation. After settling, the beam 106 is deflected relative to the previous imaging position, e.g., spacing apart the new imaging center along the x-direction or along both x- and y-directions, and the sample 102 is imaged at the new angular position and deflected beam position. The process can be repeated to form a helical sequence of images.

Figure 3:
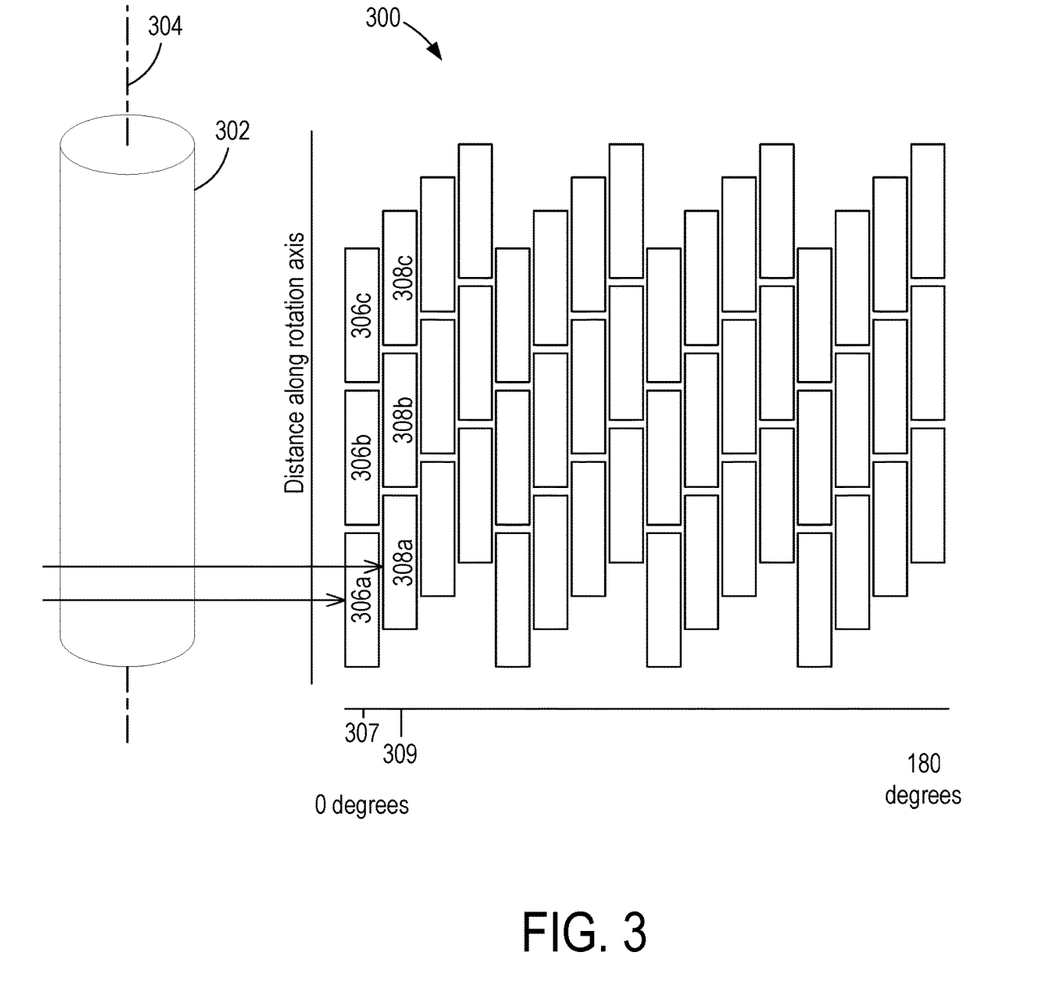
FIG. 3 is a schematic of an example image acquisition technique.

In further examples of the imaging system 100, with the movement stage 114 at a particular static orientation, e.g., after a settling duration, a series of images of the sample can be obtained by deflecting the beam 106 with the deflector 116 to a series of corresponding sample locations along the x-direction or the x- and y-directions. The spacing between images in the series can provide an image overlap, an image to image spacing with a common border, or a spacing with no overlap. Collecting image series through beam deflection to consecutive adjacent images can be convenient, but non-consecutive deflection can also be used in some examples. In some examples, the spacing can correspond to the next image in the current helix at the current rotation angle, e.g., one helical imaging period distant. Helical imaging periods can be defined the distance along an axis of rotation of the helix after which a helical trajectory completes one revolution about the axis. In further examples, the spacing can correspond to images in one or more adjacent helixes. After acquiring a series of images, the movement stage 114 rotates the sample 102 to a next rotational position, typically by a single increment, but other increment arrangements are possible including multiple increments, forward/reverse, or sequences that do not follow a strictly increasing or decreasing angle etc. After a settling duration at the next rotational position, another series of images of the sample can be obtained by deflecting the beam 106 with the deflector 116 to a series of corresponding sample locations along the x-direction or the x- and y-directions. In examples where the new rotational position is by a rotational increment, e.g., 0.5 degrees, the series of images is shifted slightly in the x-direction so that the first image in the series at the new rotational position can correspond to the next image in the helical sequence being formed by the first image in the preceding series at the preceding rotational position. One example of multiple image series is shown in FIG. 3.

In some examples, such as longer samples, the imaging system 100 can be configured to acquire a set of images at a collection of static rotational positions, such as a beam deflected series at each rotational position. Then, the movement stage 114 can translate the sample, e.g., along the x-direction or x- and y-directions, and another set of images can be acquired using movement stage rotations and beam deflections continuing from the previous set of images.

After images are acquired, various tomographic reconstruction techniques can be used to form 3D reconstructed images from the helical set or sets of images. Thus, in many disclosed examples, by acquiring multiple images through beam deflection at a single tilt position, there is minimal added movement (e.g., pm/s) because the beam deflection occurs through electronic control over the beam deflector 116. This stability leads to a reduction in the duration of total image acquisition time and an increase in image reconstruction quality due to the reduced contamination that occurs as a function of acquisition time. The sets of images can be stored in a computer memory and suitably addressed so that the reconstruction can be completed with the images in the correct sequence position.

In some examples of the imaging system 100, the movement stage 114 is configured to continuously rotate the sample 102 without a translation. During the rotation, one or more helical sequences of images can be obtained, with subsequent images in a helix obtained through beam deflection. As with some static examples previously described, a series of beam deflected images can be obtained beginning at an angular position, but with each image of the series being slightly rotationally incremented due to the continuous rotation. After continued rotation, a next series of beam deflected images can begin with a first image of the new series adjacent to the first image of preceding series (due to the continued rotation) but shifted by an amount along the x-direction, typically with the shifted first image overlapping the first image of the preceding series.

In some examples, the imaging system 100 can also be configured to provide one or more imaging sequence rotational increments through beam deflection with the beam deflector 116. For example, instead of rotating the sample 102 with the movement stage 114 to a next incremental angular position, the beam deflector 116 can be configured to deflect the beam 106 and provide the next incremental angular position. In some examples, the beam 106 can be deflected away from the axis 107, e.g., in the y-direction, such that the beam 106 can be directed back to the sample 102 at an angle with respect to the axis 107. While the angle that is produced may not be sufficient to supplant rotating the sample 102 with the movement stage 114 in its entirety, the rotational angles about the axis 107 that can be produced may be sufficient to replace one or more rotational increments performed during the acquisition of the set of images, thereby further reducing the total time required to complete sample imaging.

Figure 2:
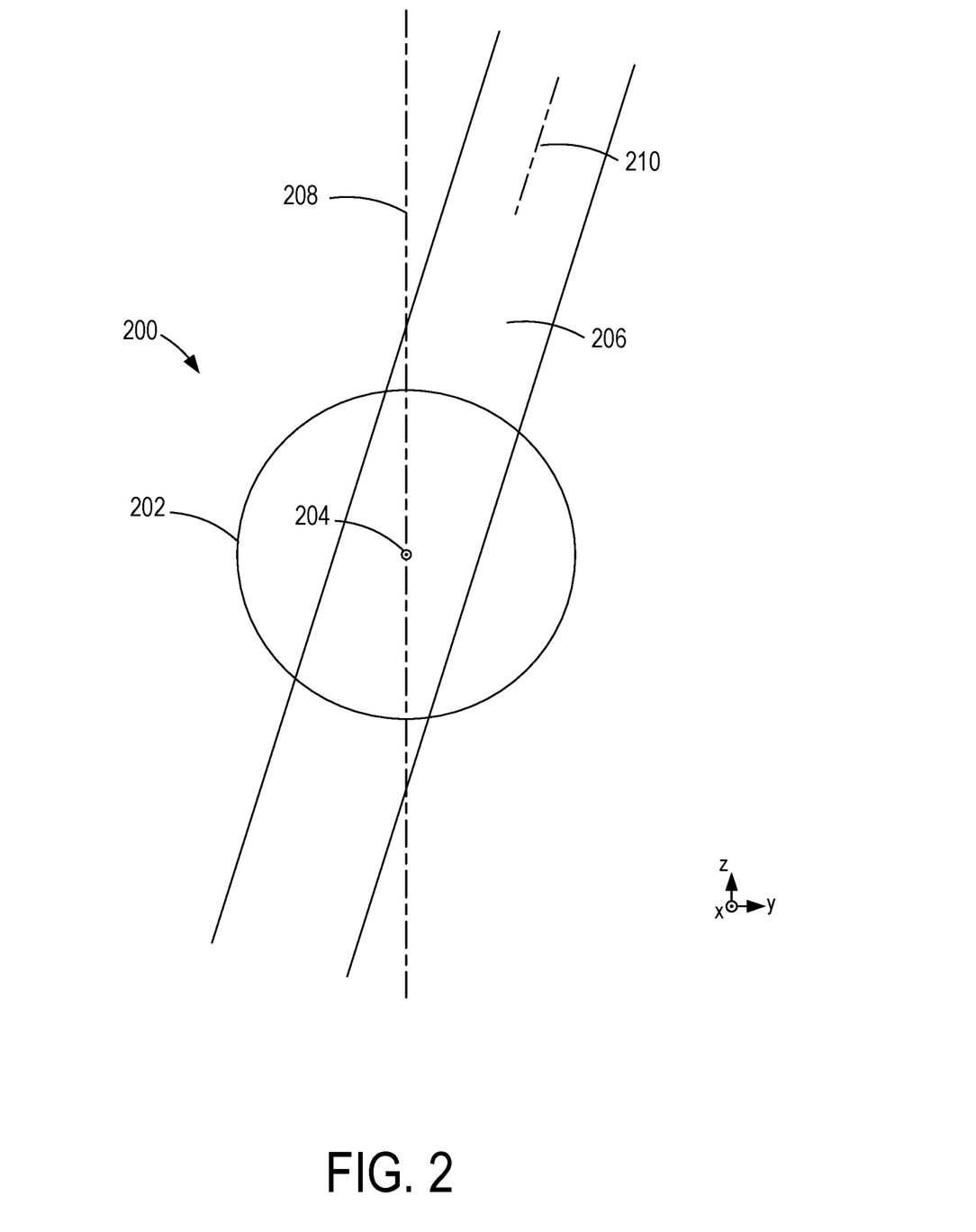
FIG. 2 is an end-view cross-section of a sample.

For example, some beam deflection examples can provide an angular range of approximately ±4 degrees. Thus, after a settling time, beam deflection can be used to complete translational image series at a plurality of rotational increments. For example, with half-degree increments and a ±4 degree beam deflection range, acquisition time can be reduced by a factor of 16. FIG. 2 shows an example cross-section 200 viewing a sample 202 on end down a rotation axis 204. A beam 206 can be directed along an axis 208 for one or more images of an image sequence, with rotation of the sample being provided by a movement stage. With controlled deflection with a beam deflector, the beam 206 can be directed at an angle with respect to the axis 208 along axis 210.

Various components of the imaging system 100 can be coupled to a controller environment 128 configured with one or more controllers, computing devices, processors, memory, and/or other components to coordinate directing the beam 106 to the sample 102, orientation and movement of the sample 102 by the movement stage 114, and deflection of the beam 106 with the beam deflector 116. The controller environment 128 can also be configured to control the lens elements 108, 110, emission of the beam 104, blanking with the beam blanker 123, temperature and/or pressure of the cryogenic volume 124, aberration correction with the descanning unit 120, and signal timing and/or synchronization of the detector 112.

Control components can include desktop or laptop computers, mobile devices, tablets, logic controllers, etc. Processors can include CPUs, GPUs, ASICs, PLCs, FPGAs, PLDs, CPLDs, etc., that can perform various data processing or I/O functions associated with the controller environment 128, such as control and/or data processing. Memory can be volatile or non-volatile (e.g., RAM, ROM, flash, hard drive, optical disk, etc.), fixed or removable, and is coupled to the processor. The memory can provide storage capacity for one or more computer-readable media. The controller environment 140 can also be situated in a distributed form so that applications and tasks are performed by remote processing devices that are linked through a communications network. Program modules and logic can be located in both local and remote memory storage devices. In some examples, components in the controller environment 140 need not be linked with other components.

In particular examples, tomographic reconstructions can be performed remotely, e.g., in a distributed computing environment, to improve processing speeds or address onerous computational loads. Various tomographic reconstruction techniques can be employed, including iterative approaches, search, expectation maximization, weighted back-projection, etc. Images can be stored and resorted where necessary so that the acquired image sequences can be tailored or adapted to standard reconstruction techniques can be adapted to this type of scanning.

Image acquisition algorithms that leverage beam deflection can be embodied as software or firmware instructions carried out by a digital computer. For instance, any of the disclosed techniques can be performed by a computer or other computing hardware that is part of or coupled to a TEM system or a STEM system. For instance, software for performing any of the disclosed embodiments can be stored on the one or more volatile, non-transitory computer-readable media as computer-executable instructions, which when executed by the one or more processors, cause the one or more processors to perform any of the disclosed techniques. The results of the image acquisitions, computations, or reconstructions can be stored (e.g., using suitable data structures or lookup table) in the one or more tangible, non-transitory computer-readable storage media and/or can also be output to the user, for example, by displaying data, images, tomographic image slice, 3D reconstructions, etc., on a display.

FIG. 3 illustrates an example of an imaging technique that can be performed with disclosed microscope examples. To address the lengthy durations of image acquisitions, multiple cylinder cross-sections can be imaged through incremental rotations as discussed previously. However, while added movements and settling durations are required in relation to disclosed beam deflection techniques, alignment presents an added difficulty. Specifically, alignment between images is needed in order to provide reconstructions of sufficient image quality. In general, alignment involves determining from which direction and from which position the images were acquired relative to the sample. Even with high quality movement stages, beam precision, and other high quality instrumentation, to obtain angstrom resolution in a tomograms reconstruction, similar angstrom resolution would be needed in positioning, which is impractical. Thus, alignment is needed to determine where the acquired image projections belong and align together with the other image projections. With disclosed helical approaches, images can be obtained that can provide conveniently overlapped and interlaced data to make the alignment problem better posed. That is, a subsequent reconstruction can determine the angles and positions of each image when formulated as a matrix inversion problem. Imaging features can also be used as features to align images against, including cracks, particles, cell fragments, etc., e.g., by using stereographic or triangulation principles. Feature alignment can also be used iteratively, such as by performing a reconstruction, varying an image parameter such as position or angle, reperforming reconstruction, and comparing image quality such as blur reduction, sharpness increase, etc.

Disclosed examples that use beam deflection can acquire sets of interwoven helical image sequences, such as image sequences 300 of a sample 302 rotatable about an axis 304, and can do so rapidly, improving both acquisition time, alignment capability, and reconstruction resolving power. As discussed previously, beam deflection can be used to rapidly obtain image series at a particular rotational position 307, such as images 306a, 306b, 306c, before mechanically rotating the sample 302 about the axis 304 to a new rotational position 309. After a settling duration, a series of images 308a, 308b, 308c can be rapidly acquired again through beam deflection, shifted along the rotational axis 304 by a predetermined amount.

In contrast, using an aforementioned series of cylindrical segments, adjacent segments with no overlap also produce reconstructions without overlap and corresponding discontinuities in the reconstruction. Thus, data from one of such segments does not generally aid in the reconstruction of an adjacent segment. By comparison, by acquiring the image sequences 300 projections collected helically allow projections collected at a lower position along the axis 304 (e.g., towards the bottom in FIG. 3) to be used in a gradual manner in aligning projections collected at a higher position along the axis 304. In other words, because the lower image projections have been aligned, the knowledge of the position of lower image projections also affects the reconstruction of the image projections higher up the axis 304 based on their entangled information. In this way, instead of using N image projections to impact the reconstruction of a cylindrical segment, 2N projections are available to impact the reconstruction for same segment. Thus, a same amount of data can be used, and acquired rapidly through beam deflection, but there are additional image projections available, and therefore additional reconstruction equations available to simplify the reconstruction computations. Thus, without beam deflection, approaches are generally limited to tilt series without translation along the rotational axis and helical approaches would be impractically long to perform given the requirement of seconds to minutes between translations due to settling durations.

Figure 4:
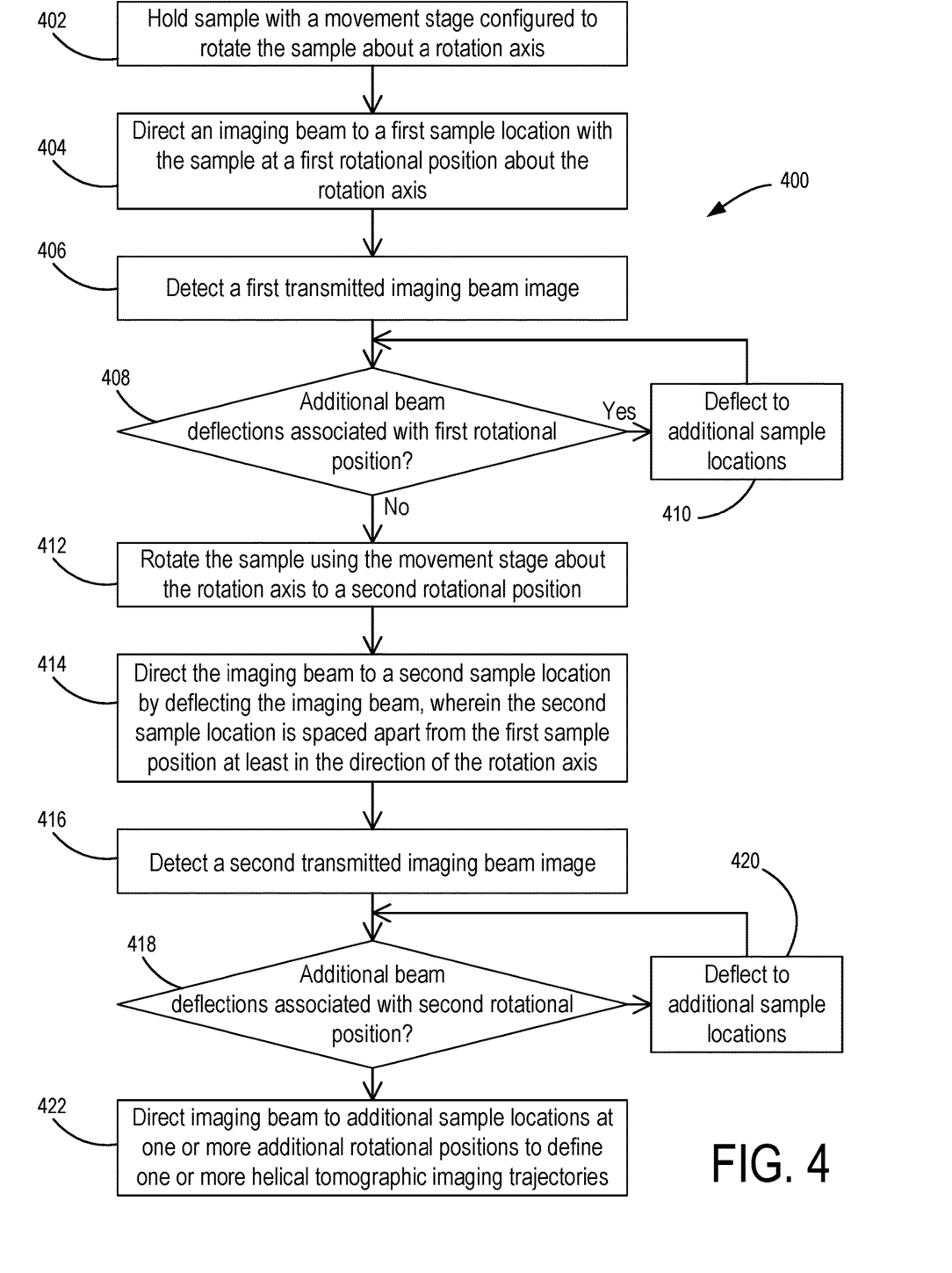
FIG. 4 is a flowchart of example methods.

FIG. 4 shows example methods 400 that can collect sets of tomographic images of microscopic samples. While the methods 400 are described with the use of electrons as imaging beam energy, it will be appreciated that other imaging beam energies may be used. At 402, a sample is held with a movement stage that can rotate the sample about a rotation axis. Movements stages can also translate/displace the sample in various directions for alignment, and also to proceed with successive series of images, such as after a maximum beam deflection reach along the direction of the rotation axis has been met. At 404, an electron beam is directed to a first sample location with the sample at a first rotational position about the rotation axis as provided by the movement stage and at 406 an electron beam image is detected with an image sensor after the electron beam is transmitted through the sample. In some examples, at 408, 410, one or more additional sample locations can be targeted by deflecting the beam in the direction of the rotation axis (e.g., along the rotation axis). After the beam deflected images are collected, at 412, the sample can be rotated to a second rotational position using the movement stage. In some examples, before movement to the second rotational position, beam deflection can be used to provide rotational position increments. At 414, the electron beam is directed to a second sample location with the sample at the second rotational position by deflecting the electron beam where the second sample location is spaced apart from the first sample position at least in the direction of the rotation axis. At 416, an electron beam image is again detected with the image sensor after the electron beam is transmitted through the sample. In some examples, at 418, 420, one or more additional sample locations can be targeted by deflecting the beam in the direction of the rotation axis (e.g., along the rotation axis). At 422, the electron beam can be directed to additional sample locations at one or more additional rotational positions, with the detected images defining one or more helical tomographic imaging trajectories.

General Considerations

As used herein, image, projection, and image projection can refer to a distribution of electrons or other imaging beam energy directed to and/or received and detected by an imaging sensor after transmission of an imaging beam through a sample, presentation of image data on a display, or data associated with a visual image such as stored in a JPG, TIFF, or other data file. Disclosed examples are described in relation to electron beams as penetrating energy used in 3D tomographic imaging, but it will be appreciated that other charged particle beam or energy beam sources can be used in some examples, including x-ray and ultrasound. While microscope examples are generally described with a selection of components for convenience of illustration and description of operating principles, it will be appreciated that other components can be included as well.

The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation. Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level descriptions of the actual operations that are performed. The actual operations that correspond to these terms will vary depending on the particular implementation and are readily discernible by one of ordinary skill in the art.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope of the appended claims.

We claim:

1. A method, comprising:
holding a sample with a movement stage configured to rotate the sample about a rotation axis;
directing an imaging beam to a first sample location with the sample at a first rotational position about the rotation axis and detecting a first transmitted imaging beam;
rotating the sample using the movement stage about the rotation axis to a second rotational position; and
directing the imaging beam to a second sample location by deflecting the imaging beam in relation to an optical axis of the imaging beam and detecting a second transmitted imaging beam, wherein the second sample location is spaced apart from the first sample location at least in relation to the optical axis.

2. The method of claim 1, wherein the second sample location being spaced apart from the first sample location at least in relation to the optical axis comprises a spacing at least in the direction of the rotation axis.

3. The method of claim 1, further comprising:
directing the imaging beam to one or more additional sample locations at one or more additional rotational positions and detecting corresponding transmitted imaging beam images;
wherein the first sample location at the first rotational position, the second sample location at the second rotational position, and the one or more additional sample locations at the one or more additional rotational positions comprise an imaging beam helical imaging trajectory for the sample.

4. The method of claim 1, further comprising:
before the sample is at the second rotational position, directing the imaging beam to one or more additional sample locations by deflecting the imaging beam, wherein the first sample location and the one or more additional sample locations are spaced apart from each other in the direction of the rotation axis.

5. The method of claim 4, wherein the sample is held at the first rotational position as the imaging beam is deflected to the one or more additional sample locations.

6. The method of claim 4, wherein the spacing of the first sample location and an adjacent one of the one or more additional sample locations corresponds to a helical imaging period.

7. The method of claim 4, wherein the spacing the one or more additional sample locations adjacent to the first sample location is part of a helical imaging trajectory separate from a helical imaging trajectory of the first sample location.

8. The method of claim 1, further comprising descanning the imaging beam after transmission through the second sample location to correct an aberration associated with the deflection.

9. The method of claim 1, further comprising reconstructing a 3D tomogram of the sample from the detected transmitted imaging beam images.

10. The method of claim 1, wherein the sample is held at the first and second rotational positions for respective durations associated with a drift attenuation threshold before the imaging beam is directed to the respective first or second sample locations while the sample is held at the respective first or second rotational positions.

11. The method of claim 1, wherein the first and second sample locations are translationally spaced apart collinear with or parallel to the rotation axis.

12. The method of claim 1, further comprising:
directing the imaging beam to a third rotational position without rotating the sample with the movement stage by deflecting the imaging beam.

13. The method of claim 1, further comprising blanking the imaging beam for one or more durations between the directing of the beam to the first sample location and the second sample location.

14. The method of claim 1, wherein the imaging beam is an electron beam.

15. The method of claim 1, further comprising directing the imaging beam to one or more additional sample locations, wherein the sample locations comprise an imaging beam circular imaging trajectory.

16. An imaging system, comprising:
imaging beam optics configured to direct an imaging beam along an optical axis to a sample to a first sample location;
a beam deflector configured to direct the imaging beam away from the optical axis to a second sample location;
a movement stage configured to hold the sample and to rotate the sample about a rotation axis angled with respect to the optical axis;
an imaging sensor configured to detect the imaging beam after transmission through the sample; and
a processor and memory coupled to the imaging beam optics, beam deflector, and movement stage, wherein the memory includes code that, when executed by the processor, causes the movement stage to rotate the sample to first and second rotational positions, and causes the beam deflector to deflect the imaging beam such that the second sample location is spaced apart from the first sample location at least in relation to the optical axis.

17. The imaging system of claim 16, wherein the second sample location being spaced apart from the first sample location at least in relation to the optical axis comprises at least a spacing in the direction of the rotation axis.

18. The imaging system of claim 16, wherein the code causes the movement stage to rotate the sample to one or more additional rotational positions and causes the beam deflector to deflect the imaging beam such that the imaging beam is directed to one or more additional sample locations spaced apart from each other and the first and second sample locations to form a helical trajectory at the sample.

19. The imaging system of claim 16, wherein the code causes the beam deflector, before the sample is at the second rotational position, to deflect the imaging beam to one or more additional sample locations, wherein the first sample location and the one or more additional sample locations are spaced apart from each other in the direction of the rotation axis.

20. The imaging system of claim 19, wherein the code is configured to cause the movement stage to hold the sample at the first rotational position as the imaging beam is deflected to the one or more additional sample locations.

21. The imaging system of claim 16, wherein the code is configured to cause the beam deflector to direct the imaging beam to a third rotational position without the movement stage rotating the sample by deflecting the imaging beam away from the rotational axis and optical axis and towards the sample at an angle.

22. The imaging system of claim 16, further comprising a descanning unit configured to descan the imaging beam after transmission through the second sample location to correct an aberration associated with the deflection.

23. The imaging system of claim 16, wherein the imaging beam is an electron beam.

24. A method, comprising:
with a sample held at a first rotational position, directing an imaging beam to a first plurality of sample locations, each of the first plurality of locations located along a rotation axis, by deflecting the imaging beam along at least a first axis, and detecting a respective plurality of transmitted imaging beams;
rotating the sample about the rotation axis to a second rotational position; and
with the sample held at the second rotational position directing the imaging beam to a second plurality of sample locations by deflecting the imaging beam along at least a second axis, and detecting a respective plurality of the transmitted imaging beams.

25. The method of claim 24, wherein the first axis and the second axis are the same axis and correspond to the rotation axis.

26. The method of claim 25, wherein one or more of the transmitted imaging beams at the first rotational position and one or more beams at the second rotational position comprise a helical imaging sequence.

* * * * *